US 7,452,657 B2
Nov. 18, 2008

(12) United States Patent
Namiki et al.

(10) Patent No.: US 7,452,657 B2
(45) Date of Patent: Nov. 18, 2008

(54) RESIST COMPOSITION, METHOD OF FORMING RESIST PATTERN, SEMICONDUCTOR DEVICE AND METHOD OF MANUFACTURING THEREOF

(75) Inventors: Takahisa Namiki, Kawasaki (JP); Koji Nozaki, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 185 days.

(21) Appl. No.: 11/237,951

(22) Filed: Sep. 29, 2005

(65) Prior Publication Data
US 2007/0003862 A1    Jan. 4, 2007

(30) Foreign Application Priority Data
Jun. 16, 2005    (JP) .............................. 2005-177031

(51) Int. Cl.
*G03F 7/004* (2006.01)
*G03F 7/30* (2006.01)

(52) U.S. Cl. .................... 430/270.1; 430/192; 430/326; 430/330

(58) Field of Classification Search ................. 430/191, 430/192, 270.1, 326, 320, 193, 18, 330
See application file for complete search history.

(56) References Cited

U.S. PATENT DOCUMENTS

| 3,853,559 | A | * | 12/1974 | Levinos et al. | ........... 430/270.1 |
| 4,174,222 | A | * | 11/1979 | Komine et al. | .............. 430/190 |
| 4,536,465 | A | | 8/1985 | Uehara | |
| 5,173,117 | A | * | 12/1992 | Inokawa et al. | ............. 106/823 |
| 5,183,722 | A | * | 2/1993 | Tsutsumi et al. | ............ 430/169 |
| 6,156,476 | A | * | 12/2000 | Takeyama et al. | ........ 430/270.1 |
| 6,291,059 | B1 | | 9/2001 | Mahoney | |
| 2004/0121259 | A1 | | 6/2004 | Kozawa et al. | |

FOREIGN PATENT DOCUMENTS

| JP | 51075435 A | 6/1976 |
| JP | 53-115301 | 10/1978 |
| JP | 04266901 A | 9/1992 |
| JP | 07-128843 A | 5/1995 |
| JP | 07-128853 A | 5/1995 |
| JP | 07-209858 A | 8/1995 |
| JP | 10-003165 A | 1/1998 |
| JP | 2000-98630 A | 4/2000 |
| JP | 2002-47375 A | 2/2002 |
| JP | 2002-053699 A | 2/2002 |
| JP | 3275367 B2 | 2/2002 |
| KR | 2004-0026128 A | 3/2004 |
| WO | 9711109 A1 | 3/1997 |

OTHER PUBLICATIONS

Tannin, from WIKIPEDIA http://en.wikipedia.org/wiki/Tannin.*
European Search Report dated Feb. 8, 2006, issued in corresponding European Patent Application No. 05-021539.
Office Action dated Oct. 24, 2006 issued in corresponding Korean Application No. 10-2005-0091525.

* cited by examiner

*Primary Examiner*—John S Chu
(74) *Attorney, Agent, or Firm*—Westerman, Hattori, Daniels & Adrian, LLP.

(57) ABSTRACT

The resist composition of the present invention contains at least one of a tannin and a derivative thereof. The method of forming a resist pattern of the present invention includes: forming a resist film on a surface of an object to be processed, by using the resist composition; and exposing and developing the resist film. The method of manufacturing a semiconductor device of the present invention includes: forming a resist film on a surface of an object to be processed, by using the resist composition; exposing and developing the resist film to form a resist pattern; and patterning the surface of the object by performing an etching through the resist pattern as a mask.

18 Claims, 10 Drawing Sheets

RESIST COMPOSITION, METHOD OF FORMING RESIST PATTERN, SEMICONDUCTOR DEVICE AND METHOD OF MANUFACTURING THEREOF

CROSS-REFERENCE TO RELATED APPLICATIONS

This application is based upon and claims the benefit of priority from the prior Japanese Patent Application No. 2005-177031, filed on Jun. 16, 2005, the entire contents of which are incorporated herein by reference.

BACKGROUND OF THE INVENTION

1. Field of the Invention

The present invention relates to a resist composition suited to the formation of a fine, highly-detailed resist pattern, and in particular, to a resist composition using a molecular resist in which the occurrence of nanoedge roughness can be suppressed, and to a method of forming a resist pattern, a semiconductor device, and a method of manufacturing thereof using the resist composition.

2. Description of the Related Art

Conventionally, polymers are generally used as resist compositions for forming resist patterns, from the standpoint that a coated film can be easily obtained at the time of coating by using the resist composition as a coating solution and by using spin coating or the like, and from the standpoint that, due to the exposure thereafter, it is easy for a reaction such as making insoluble or making easily soluble or the like to occur at the developing liquid, or the like. Specifically, examples of the polymer include novolak resin, polyacrylic acid, polyvinyl phenol, polyvinyl pyrrolidone, polyvinyl alcohol, styrene-maleic acid copolymer, melamine resin, and the like.

However, in resist compositions using these polymers, the unit molecules which dissolve in a developing liquid are giant polymer molecules. Therefore, roughness on the order of several tens of nm (hereinafter called "nanoedge roughness" upon occasion) arises at the pattern edges at the time of resolving. As patterns have become more and more fine in recent years, the occurrence of nanoedge roughness has become a great problem.

Thus, in order to suppress the occurrence of nanoedge roughness, research on resist compositions which use monomer molecules instead of polymers which are giant molecules has advanced. Such a resist composition is called a molecular resist, and research on these molecular resists has started in recent years. For example, resist compositions using water-soluble molecules of a calixarene or polyphenyl skeletons, or the like are used as the molecular resist.

However, these molecular resists are a special molecular configuration and are expensive (one gram costs from several thousand yen to several ten-thousand yen), and as compared with polymers, the crystallinity thereof is high, and therefore, the film forming ability thereof is poor. When they are used as a coating liquid, only organic solvents can be used as the solvent, an exclusive-use developing liquid is needed for development, and an exclusive-use removing liquid is needed in the removing of the resist film. Therefore, the problems arise that the costs and the burden on the environment increase.

As a result of studies, the present inventors have found that the aforementioned various problems can be improved by using tannins and derivatives thereof as molecular resists.

As examples of using tannins, there is known, for example, adding and using crosslinking agents or polymerization initiators as examples of organic matter (see Japanese Patent Application Laid-Open (JP-A) Nos. 2002-47375 and 2002-53699). In this case, inorganic fibers are kneaded-in and layered, and the tannins are used in order to fabricate a so-called prepreg for a printed wiring board and not used as a resist to be used for patterning. Further, although the aforementioned JP-A Nos. 2002-47375 and 2002-53699 mention lignin (a component of wood), there is no disclosure whatsoever of how to use tannins.

Further, it has been known that tannins can be used as components of photosensitive compositions (refer to Japanese Patent (JP-B) No. 3275367 and JP-A Nos. 7-128843, 7-128853, 7-209858, and 10-3165). However, in these cases, the tannins are structural units of polymers, and the tannins are used after being copolymerized and made into polymers. Therefore, there is the problem that they cannot aim to reduce nanoedge roughness, reduce costs, and reduce the burden on the environment.

Accordingly, the current situation is that there has not yet been provided a resist composition which can easily and efficiently and at a low cost form a fine, highly-detailed resist pattern at which nanoedge roughness can be suppressed, nor related techniques utilizing such a resist composition.

An object of the present invention is to provide a resist composition which can easily and efficiently and at low cost form a fine, highly-detailed resist pattern at which the occurrence of nanoedge roughness can be suppressed, and further, whose burden on the environment is small; and a method of forming a resist pattern which, by using the resist composition, can easily and efficiently and at a low cost form a fine, highly-detailed resist pattern without nanoedge roughness which can cause problems; and a method of manufacturing a semiconductor device which, by using the resist composition, can form a fine, highly-detailed resist pattern without nanoedge roughness which can cause problems, the method enabling efficient mass production of a high-performance semiconductor device having a fine wiring pattern formed by using the resist pattern; and a high-performance semiconductor device having a fine wiring pattern and manufactured by the method of manufacturing a semiconductor device.

As the result of diligent studies, the present inventors have obtained the following findings. Namely, the present inventors have found that, when using a molecular resist, and in particular, at least one of a tannin and derivatives thereof, as a resist composition for forming a resist pattern, tannins and derivatives thereof can be obtained inexpensively (100 grams for about 2000 yen), and the film forming ability thereof is good despite the fact that they are low molecules, and they suppress the occurrence of nanoedge roughness such that a fine resist pattern can be obtained. Further, the present inventors have found that, because tannins are water soluble, water can be used as a coating solvent and a developing liquid, an alkali aqueous solution can be used at the time of resist removing, costs and the burden on the environment can be reduced, and in particular, when the tannin is a natural product, the burden on the environment can be reduced even more, and the present inventors thereby completed the present invention.

SUMMARY OF THE INVENTION

The resist composition according to the present invention exhibits operational effects as a so-called "molecular resist", and contains at least one of a tannin and a derivative thereof. The resist composition is a molecular resist in which the tannin and the derivative thereof are monomer molecules. In the resist composition, the occurrence of nanoedge roughness (roughness on the order of several tens of nm which arises at the pattern edges at the time of resolving), which arises in a case in which giant polymer molecules are used, is suppressed. Namely, when a resist layer 102 is formed on a wiring layer 100 by using the resist composition of the present invention, as shown in FIG. 10A, the resist layer 102 is structured by a plurality of minute tannin molecules 104. Therefore, in a resist pattern 106 which is formed after exposure and development, as shown in FIG. 10B, the differences in the pattern dimensions are small, and the occurrence of nanoedge roughness is suppressed. On the other hand, when a resist layer 110 is formed on the wiring layer 100 by using a conventional resist composition, as shown in FIG. 11A, the resist layer 110 is structured by a plurality of giant polymer molecules 112 whose sizes are different. Therefore, in a resist pattern 114 which is formed after exposure and development, as shown in FIG. 11B, the differences in the pattern dimensions are large, and great nanoedge roughness occurs. The occurrence of nanoedge roughness varies in accordance with whether or not the giant polymer molecules 112 are removed at a pattern edge at the time of developing, and differences in pattern dimensions appear markedly due to these variations.

Further, although each of the tannin and the derivative thereof is low-molecular substance, the film forming ability thereof is good. Therefore, they can be suitably used in the formation of fine and highly-detailed resist patterns. Moreover, because each of the tannin and derivative thereof is water soluble, water can be used as the coating solvent and the developing liquid, and costs and the burden on the environment are reduced. In particular, in a case in which the tannin is a natural product, the burden on the environment is reduced even more.

The method of forming a resist pattern according to the present invention comprises: forming a resist film on a surface of an object to be processed, by using a resist composition; and exposing and developing the resist film, wherein the resist composition contains at least one of a tannin and a derivative thereof. In this method of forming a resist pattern, after a resist film is formed, by using the resist composition according to the present invention, on the surface of an object to be processed, the resist film is exposed and developed. As a result, a resist pattern can be formed simply, efficiently, and at a low cost. Because the resist pattern is formed by using the resist composition according to the present invention which contains at least one of a tannin and a derivative thereof, the resist pattern is fine and highly-detailed, and does not have nanoedge roughness which can cause problems.

The method of manufacturing a semiconductor device according to the present invention comprises: forming a resist film on a surface of an object to be processed, by using a resist composition; exposing and developing the resist film to form a resist pattern; and patterning the surface of the object by performing an etching through the resist pattern as a mask, wherein the resist composition contains at least one of a tannin and a derivative thereof.

In this method of manufacturing a semiconductor device, first, the resist film is formed by using the resist composition according to the present invention on the surface of an object on which a pattern such as a wiring pattern is formed thereafter, and then the resist film is exposed and developed. Thus, a fine and highly-detailed resist pattern can be formed without nanoedge roughness which can cause problems. Next, by performing an etching using the resist pattern thus formed as a mask, the surface of the object is patterned finely and in great detail and with good dimensional accuracy. Therefore, it is possible to efficiently manufacture a high-quality, high-performance semiconductor device, which has a pattern such as a wiring pattern or the like which is extremely fine and is highly detailed and has excellent dimensional accuracy.

The semiconductor device according to the present invention is manufactured by the method of manufacturing a semiconductor device according to the present invention. This semiconductor device has a pattern such as a wiring pattern or the like which is extremely fine and is highly detailed and has excellent dimensional accuracy, and the semiconductor device is high-quality and high-performance.

BRIEF DESCRIPTION OF THE DRAWINGS

FIG. 1B is a sectional view schematically showing a resist pattern in which nanoedge roughness is great and which is formed by using the conventional resist composition.

Figure 1:
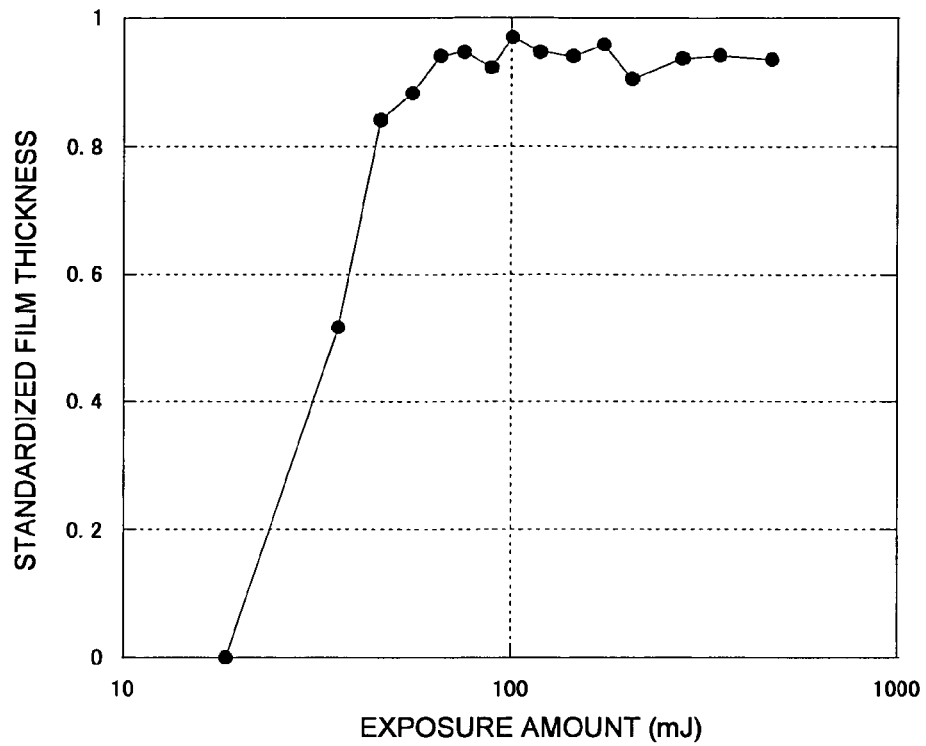
FIG. 1 is a graph showing an exposure curve at the time of exposing a resist composition of Example 1 by light of a wavelength of 248 nm.

DESCRIPTION OF THE PREFERRED EMBODIMENTS (Resist Composition)

The resist composition according to the present invention contains at least of a tannin and a derivative thereof, and may contain a crosslinking agent, alcohols, pinacols, an acid generator, a solvent, and other components, which are appropriately selected as needed.

—Tannins and Derivatives Thereof—

Tannin is a generic term for substances which are extracted from plants and can tan the skin of an animal. Generally, a large amount of tannin exists in particular in the portion where a plant is stuck into an animal or the like, and the tannin can be extracted from this portion.

Tannins usually cost about 2000 yen per 100 grams, and can be obtained inexpensively. The mass average molecular mass thereof is around 500 to 20,000, and the film forming ability thereof is good even though they are low molecular mass.

There are hydrolyzable tannins and condensed tannins. Usually, the molecular structures thereof are complex and are not a single component.

The hydrolyzable tannin is not particularly limited, and can be appropriately selected in accordance with the object. An example is a structure forming an ester bond with an aromatic compound, such as gallic acid or ellagic acid or the like. Specific suitable examples include Chinese tannin expressed by following structural formula (1), Turkish tannin expressed by following structural formula (4).

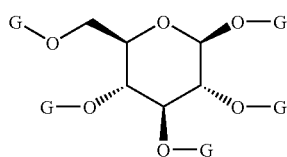

Structural formula (1)

where G in the structural formula (1) represents either of gallic acid expressed by following structural formula (2) or a dimer of gallic acid expressed by following structural formula (3). Note that, a plurality of molecules, in which the numbers of the gallic acid are different, exist in the tannin, and generally, what is called "tannin" usually means the Chinese tannin.

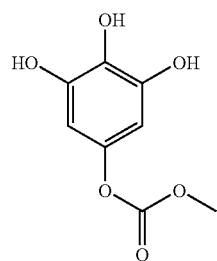

Structural formula (2)

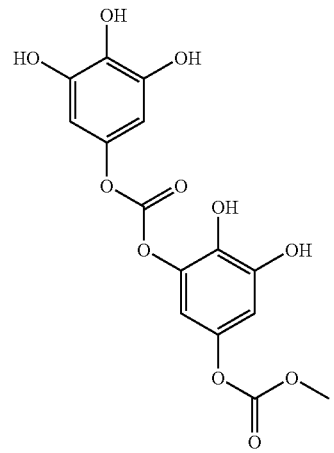

Structural formula (3)

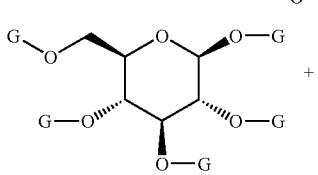

Structural formula (4)

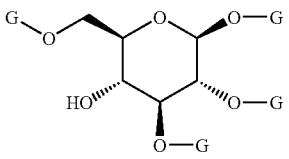

where G in the structural formula (4) represents either of gallic acid expressed by the structural formula (2) or a dimer of gallic acid expressed by the structural formula (3).

In addition, hydrolyzable tannins include ellagitannins. However, only the bonding proportion (ratio) of the gallic acid and the structure of the monosaccharide ring portion at the bond region of the gallic acid are slightly different, and therefore, there is no great difference, in terms of structure, from Chinese tannin and Turkish tannin.

The condensed tannin is not particularly limited, and can be appropriately selected in accordance with the object. An example is a structure in which a compound having a flavanol skeleton is polymerized. Specific suitable examples include wattle tannin expressed by following structural formula (5), quebracho tannin expressed by following structural following formula (6), and the like. In addition, gambier tannin, cutch tannin, flavatannins, and the like can also be used.

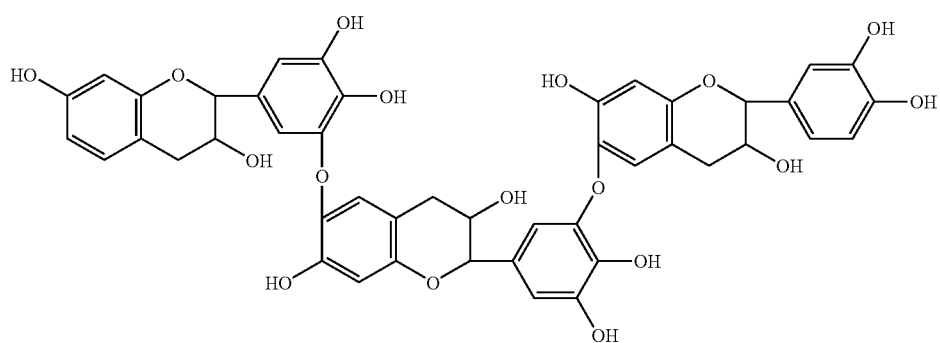

Structural formula (5)

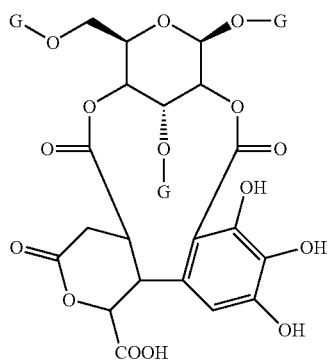

Structural formula (6)

The derivatives of the tannins are not particularly limited, and can be appropriately selected in accordance with the object. Examples are structures in which at least one, preferably three or less, of the hydrogen atoms within the tannin molecule are substituted by a substituent having 200 or less of mass average molecular mass. The substituent is not particularly limited, and can be appropriately selected in accordance with the object. Examples include alkyl group, alkoxyalkyl group, and aryl group.

It is preferable that at least some of the hydroxyl groups in the tannin and/or the derivative thereof are substituted by protective groups. Tannin and derivative thereof have many hydroxyl groups and exhibit good water solubility. By blocking the hydroxyl groups by protective groups, the water solubility can be controlled, and the exposure sensitivity, the resolution, and the like can be made even more suitable.

The protective group is not particularly limited, and can be appropriately selected in accordance with the object. For example, alkyl group, phenyl group, and the like are suitable examples from the standpoints that the substitution reaction is easy, the ratio of the protective groups is easy to control, and the water solubility can be greatly varied by a small amount of protective groups.

The content of the tannin and/or the derivative thereof is not particularly limited, and can be appropriately selected in accordance with the object. However, in a resist composition used in the formation of a resist film, it is preferable that the mass ratio thereof be the largest among the mass ratios of the other components of the resist (the components other than the tannin and derivative thereof, such as a crosslinking agent, an acid generator, and the like which will be described later). Due to the reactivity of the tannin and the derivative thereof, the tannin, the derivative thereof and an existing polymer for a resist can be used as a composition. In this case as well, the costs and burden on the environment can be reduced, but from the standpoint of suppressing the occurrence of nanoedge roughness, it is preferable to not use the polymer for a resist, and to use the tannin and/or derivative thereof as the main component.

The resist composition preferably hardly includes any polymers, and specifically, it is preferable that the content of polymers is 1/100 or less in a mass ratio with respect to the solid content of the resist composition. In this case, the occurrence of nanoedge roughness can be suppressed effectively.

Note that, for the purpose of improving the coatability of the resist composition, there are cases in which, for example, a small amount of a surfactant or the like is added, and cases in which the surfactant corresponds to the polymer. However, in these cases as well, the added amount thereof does not exceed 1/100 in a mass ratio with respect to the solid content of the resist composition.

The polymer is a high molecular mass condensate or polymer having a simple repeating structure occurring due to a low molecule compound repeating the same reaction or a similar reaction. Tannins having a mass average molecular mass of 500 to 20,000 have a complex structure in which the gallic acid bonds non-uniformly to the monosaccharide ring skeleton and do not have a simple repeating structure, and therefore, are not contained in the polymer.

—Crosslinking Agent—

By using the crosslinking agent together with the tannin and/or derivative thereof, the tannin and/or the derivative thereof can become higher molecular mass by crosslinking reaction and can relate. Therefore, the resist composition of the present invention can be made to be water insoluble, and can be used as a negative resist.

The crosslinking agent is not particularly limited, and can be appropriately selected in accordance with the object. Suitable examples include melamine derivatives, urea derivatives, uryl derivatives, pyrogallol derivatives, and the like.

Specific suitable examples of the melamine derivatives include structures expressed by following structural formula (7), specific suitable examples of the urea derivatives include structures expressed by following structural formula (8), specific suitable examples of the uryl derivatives include structures expressed by following structural formula (9), and specific suitable examples of the pyrogallol derivatives include structures expressed by following structural formula (10).

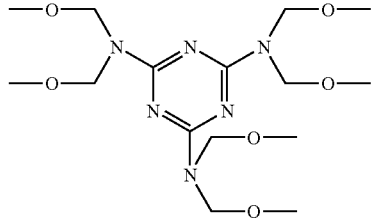

Structural formula (7)

Structural formula (8)

-continued

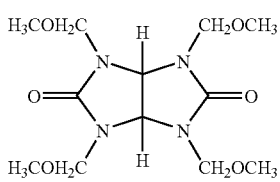
Structural formula (9)

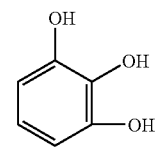
Structural formula (10)

Further, an alcohol having two or more hydroxyl groups can be used as the crosslinking agent.

The alcohol is not particularly limited, and can be appropriately selected in accordance with the object. Examples include 1,4di(hydroxymethyl)benzene, 2,6-bis(hydroxymethyl)-p-cresol, and the like.

The content of the crosslinking agent is not particularly limited, and can be appropriately selected in accordance with the object. Per 100 parts by mass of the tannin and/or derivative thereof, 5 parts by mass to 50 parts by mass is preferable, and 20 parts by mass to 40 parts by mass is more preferable.

If the content is lower than 5 parts by mass, the reactivity may be poor, the exposure sensitivity may be poor, and the film reduction may be marked. If the content exceeds 50 parts by mass, the film forming ability may be poor.

—Alcohols and Pinacols—

Instead of adding the crosslinking agent and gelling the tannin and/or derivative thereof, by adding alcohols or pinacols or the like and changing the polarity of the tannin and/or derivative thereof, the resist composition of the present invention can be made to function as a negative resist.

Due to a dehydration-condensation-reaction of the alcohol with the hydroxyl groups in the tannin or derivative thereof as shown by the following reaction formula (a reaction formula of dehydration condensation using 1-adamantanol), the polarity of the tannin or the derivative thereof can be varied from large (water soluble) to small (water insoluble) and can be made to be negative.

The alcohols are not particularly limited, and can be appropriately selected in accordance with the object. Suitable examples include 1-adamantanol, 2-adamantanol, 2-methyl-2-adamantanol, benzyl alcohol, and the like.

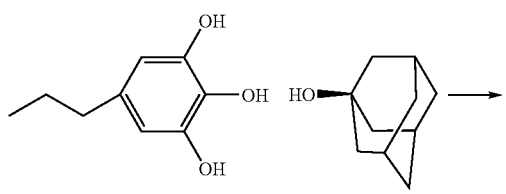

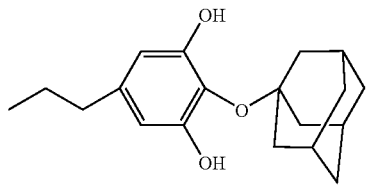

Due to the pinacols themselves carrying out pinacol translocation as shown by the following reaction formula, the polarity of the tannin and/or the derivative thereof can be varied from large (water soluble) to small (water insoluble) and can be made to be negative.

The pinacols are not particularly limited, and can be appropriately selected in accordance with the object. Suitable examples include pinacol, benzopinacol, and the like.

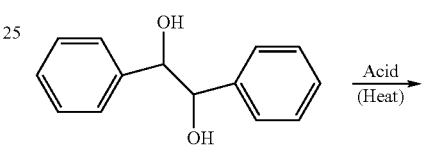

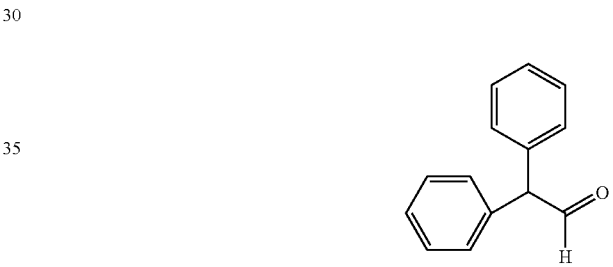

The content of the alcohols and the pinacols are not particularly limited, and can be appropriately selected in accordance with the object. Per 100 parts by mass of the tannin and the derivative thereof, 5 parts by mass to 50 parts by mass is preferable, and 20 parts by mass to 40 parts by mass is more preferable.

If the content is lower than 5 parts by mass, the reactivity is poor, the exposure sensitivity may be poor, and the film reduction may be marked. If the content exceeds 50 parts by mass, the film forming ability may be poor.

—Acid Generator—

By adding the acid generator, the reaction due to the exposure can be started effectively.

The acid generator is not particularly limited, and can be appropriately selected in accordance with the object. Suitable examples include the halogenated organic matters expressed by following structural formulas (11) through (18), the sulfonate esters expressed by following structural formulas (19) through (33), the various onium salts expressed by following structural formulas (34) through (37), and the like. Among these, onium salts are particularly preferable in terms of having excellent exposure sensitivity and resolution.

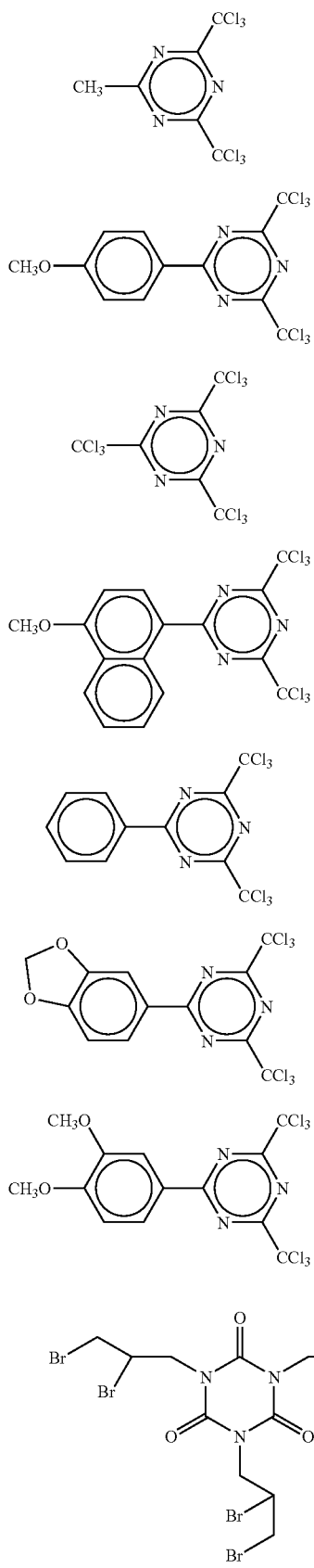
Structural formula (11)
Structural formula (12)
Structural formula (13)
Structural formula (14)
Structural formula (15)
Structural formula (16)
Structural formula (17)
Structural formula (18)
-continued
Structural formula (19)
Structural formula (20)
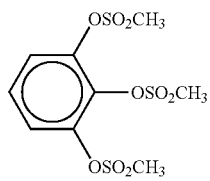
Structural formula (21)
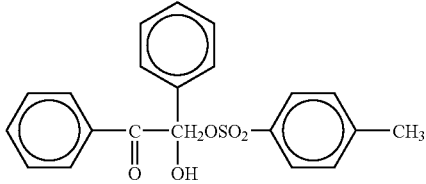
Structural formula (22)
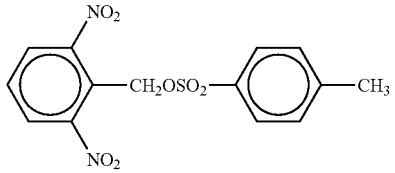
Structural formula (23)
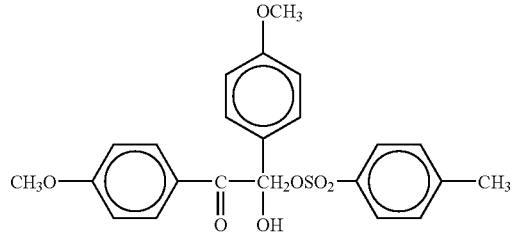
Structural formula (24)
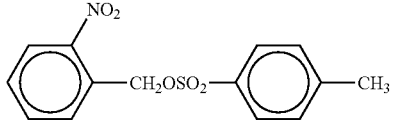
Structural formula (25)
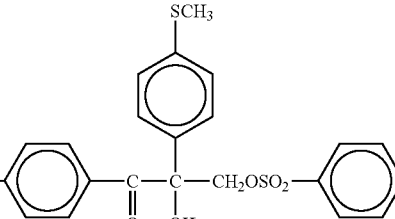
Structural formula (26)
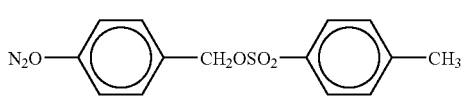

Structural formula (27)
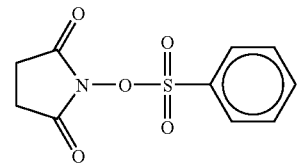

Structural formula (28)
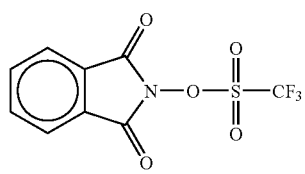

Structural formula (29)
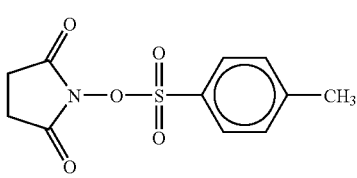

Structural formula (30)
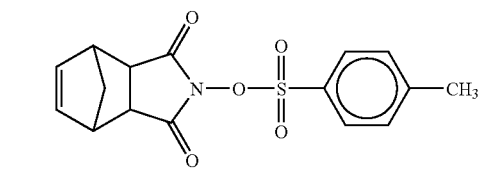

Structural formula (31)
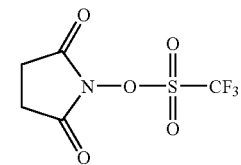

Structural formula (32)
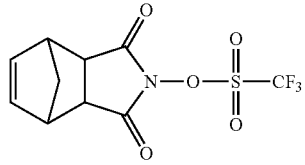

Structural formula (33)
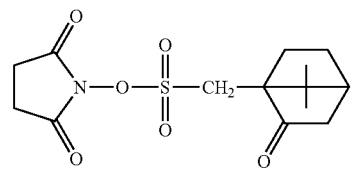

Structural formula (34)
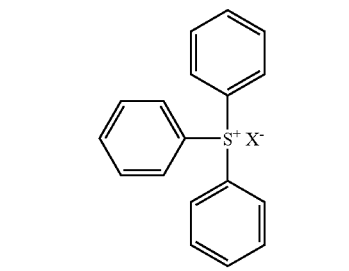

Structural formula (35)
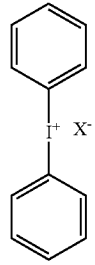

Structural formula (36)
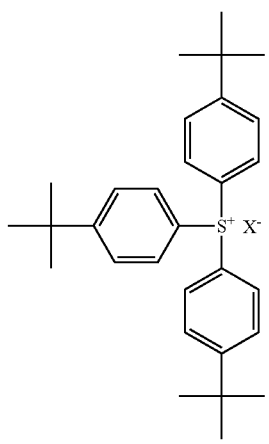

Structural formula (37)
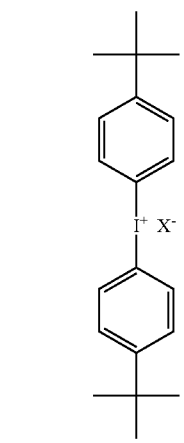

wherein, in structural formulas (34) through (37), X represents any one of $CF_3SO_3$, $CF_3CF_2CF_2CF_2SO_3$, $SbF_6$, $AsF_6$, $BF_4$ and $PF_6$.

The amount of the acid generator used is not particularly limited, and can be appropriately selected in accordance with the object. Per 100 parts by mass of the tannin and the derivative thereof, 1 part by mass to 30 parts by mass is preferable, and 3 parts by mass to 20 parts by mass is more preferable.

If the used amount is lower than 1 part by mass, there are cases in which the reactivity is poor and the exposure sensitivity is poor. If the used amount exceeds 30 parts by mass, there are cases in which the film forming ability is poor, the contrast is poor, and the resolution is poor.

—Solvent—

It is preferable that the at least one of a tannin and a derivative thereof is dissolved in the solvent. In this case, the resist composition can be used as a coating liquid.

The solvent is not particularly limited, and can be appropriately selected in accordance with the object. Examples include ethyl lactate, propyleneglycol monomethylether acetate, water, and the like which are generally used as coating solvents. Among these, water is preferable from the standpoint that costs and the burden on the environment can be reduced.

It is preferable that the water is neutral, and the pH of the water is preferably, for example, 4 to 10. If the pH is less than 4, the solution overall tends toward acidic, and therefore, the reaction of the resist composition may proceed even without exposure and the storage stability of the resist composition is adversely affected. If the pH exceeds 10, the reactivity may be poor and the exposure sensitivity may be poor.

—Other Components—

The other components are not particularly limited provided that they do not impair the effects of the present invention, and can be appropriately selected in accordance with the object, and various types of known additives are examples thereof. For example, when the purpose is improving the solubility and the coatability of the resist composition, isopropyl alcohol, surfactants, or the like can be added.

The surfactant is not particularly limited, and can be appropriately selected in accordance with the object. Examples include non-ionic surfactants, cationic surfactants, anionic surfactants, amphoteric surfactants, and the like. These may be used alone or in combination of two or more. Among these, non-ionic surfactants are preferable with regard to the point that they do not contain metal ions.

Suitable examples of the non-ionic surfactants include surfactants selected from alkoxylate surfactants, fatty acid ester surfactants, amide surfactants, alcohol surfactants, and ethylene diamine surfactants. Specific examples thereof include polyoxyethylene-polyoxypropylene condensate compounds, polyoxyalkylene alkylether compounds, polyoxyethylene alkylether compounds, polyoxyethylene derivative compounds, sorbitan fatty acid ester compounds, glycerin fatty acid ester compounds, primary alcohol ethoxylate compounds, phenolethoxylate compounds, nonylphenolethoxylates, octylphenolethoxylates, lauryl alcohol ethoxylates, oleyl alcohol ethoxylates, fatty acid esters, amides, natural alcohols, ethylenediamines, secondary alcohol ethoxylates, and the like.

The cationic surfactant is not particularly limited, and can be appropriately selected in accordance with the object. Examples include alkyl cationic surfactants, amide quaternary cationic surfactants, ester quaternary cationic surfactants, and the like.

The amphoteric surfactant is not particularly limited, and can be appropriately selected in accordance with the object. Examples include amine oxide surfactants, betaine surfactants, and the like.

The content of the surfactant in the resist composition can be appropriately determined in accordance with the type, the content, and the like of a silicon-containing polymer having at least the alkali-soluble group, the organic solvent, and the like.

When a resist pattern is formed by using the resist composition of the present invention, it is preferable that the obtained resist pattern (the resist film) has excellent etching resistance.

The etching rate is not particularly limited, and can be appropriately selected in accordance with the object, and varies in accordance with the type of gas, the pressure, the voltage, and the like. For example, in a case in which a mixed gas in which the ratio of carbon tetrafluoride to oxygen is 96:4 is used as the etching gas under the conditions of the electrode voltage being 50 W/cm$^2$ and the pressure being 0.03 Torr, the etching rate is preferably 125% or less with respect to the etching rate of a novolak resist which is generally used, and, with regard to the point of being able to sufficiently withstand actual use, is more preferably 110% or less.

Note that the etching rate can be measured by, for example, carrying out etching processing for a predetermined time by using a known etching device, and measuring the film reduction amount of the sample, and calculating the film reduction amount per unit time.

Because the resist composition according to the present invention includes a molecular resist of a tannin and/or a derivative thereof, it can easily and efficiently form a fine, highly-detailed resist pattern in which the occurrence of nanoedge roughness can be suppressed.

Further, the resist composition according to the present invention is suited to etching applications, and the method of forming a resist pattern according to the present invention can be particularly suitably used in the method of manufacturing a semiconductor device according to the present invention or the like.

(Method of Forming Resist Pattern)

The method of forming a resist pattern according to the present invention comprises: forming a resist film on a surface of an object to be processed, by using the above-mentioned resist composition according to the present invention; and exposing and developing the resist film, and may further comprise other processes which are appropriately selected as needed.

<Resist Film Forming Process>

The resist film forming process is a process of forming a resist film on a surface of an object to be processed, by using the resist composition according to the present invention.

The resist film can be formed by a known method, e.g., coating or the like. The method of coating is not particularly limited, and can be appropriately selected from among known coating methods in accordance with the object. Suitable example is spin coating. In the case of spin coating, the conditions are, for example, a rotation speed of about 100 rpm to 10,000 rpm and 800 rpm to 5,000 rpm is preferable, and a coating time of about 1 second to 10 minutes and 1 second to 90 seconds is preferable.

The thickness at the time of coating is not particularly limited and can be appropriately selected in accordance with the object.

At the time of coating or thereafter, it is preferable to bake (raise the temperature and dry) the coated resist composition. The conditions, method, and the like thereof are not particularly limited provided that they do not soften the resist film, and can be appropriately selected in accordance with the object. For example, as the temperature thereof, about 40° C. to 150° C. is preferable and 80° C. to 120° C. is more preferable, and as the time thereof, about 10 seconds to 5 minutes is preferable and 30 seconds to 90 seconds is more preferable.

The surface to be processed (base material) is not particularly limited, and can be appropriately selected in accordance with the object. In a case in which the resist film is formed at an electronic device such as a semiconductor device or the like, the surface of the semiconductor base material is an example of the surface-to-be-processed (base material), and specifically, suitable examples thereof are the substrate such as a silicon wafer or the like, various types of oxide films, and the like.

<Exposure Process>

The exposure process is a process of exposing the resist film by exposure light.

The exposure can be carried out suitably by a known exposing device, and can be carried out. By carrying out the irradiation of exposure light on some regions of the resist film, those some regions are hardened, and in a developing process which will be described hereinafter, the unhardened regions which are other than the some hardened regions are removed, thereby a resist pattern is formed.

<Developing Process>

The developing process is a process of, after exposing the resist film by exposure light and hardening the exposed regions of the resist film in the above exposing process, developing the resist film by removing the unhardened regions, thereby a resist pattern is formed.

The method of removing the unhardened regions is not particularly limited and can be appropriately selected in accordance with the object. Examples include a method of removing by using a developing liquid, and the like.

The developing liquid is not particularly limited, and can be appropriately selected in accordance with the object. However, it is preferable that the developing liquid contain at least water, from the standpoint of being able to dissolve and remove the resist film which is formed by the resist composition of the present invention which includes the tannin and/or derivative thereof which are water soluble. By using water, the burden on the environment can be reduced, and because the majority of the waste developing liquid after developing is formed from water and the tannin or the like which is a natural product, the processing costs can be reduced.

By carrying out the developing, the portions of the resist film, which was not irradiated by the exposure light, are dissolved and removed, and the resist pattern is formed (developed).

According to the method of forming a resist pattern according of the present invention, it is possible to easily and efficiently form a fine, highly-detailed resist pattern in which the occurrence of nanoedge roughness is suppressed. Therefore, the method of forming a resist pattern of the present invention can be suitably applied to the manufacturing of, for example, functional parts such as mask patterns, reticle patterns, magnetic heads, LCDs (liquid crystal displays), PDPs (plasma display panels), SAW filters (surface-acoustic-wave filters), and the like, and optical parts used in the connecting of optical wires, and fine parts such as microactuators and the like, and semiconductor devices. The method of forming a resist pattern of the present invention can be suitably used in the method of manufacturing a semiconductor of the present invention.

(Semiconductor Device and Method of Manufacture Thereof)

The semiconductor device according to the present invention is obtained by the method of manufacturing a semiconductor device according to the present invention.

The method of manufacturing a semiconductor device according to the present invention comprises: forming a resist pattern process and a patterning process, and further comprises other processes which are appropriately selected as needed.

<Resist Pattern Forming Process>

The resist pattern forming process is a process of forming a resist pattern by forming a resist film on a surface of an object to be processed, by using the resist composition according to the present invention, and exposing and developing the resist film. A resist pattern is formed on the surface of an object to be processed by this resist pattern forming process.

Details of the resist pattern forming process are the same as the method of forming the resist pattern of the present invention.

Note that examples of the surface of an object to be processed include the surface layers of the various members in a semiconductor device, and suitable examples are the substrate, such as a silicon wafer or the like, and the surfaces thereof, and various types of oxide films, and the like. The method of exposure is as described previously. The resist pattern is as described previously.

<Patterning Process>

The patterning process is a process of patterning the surface of the object by performing an etching, by using the resist pattern as a mask or mask pattern.

The method of etching is not particularly limited, and can be appropriately selected from among known methods in accordance with the object. Dry etching and the like are suitable examples. The conditions of the etching are not particularly limited, and can be appropriately selected in accordance with the object.

<Other Processes>

The other processes are not particularly limited, and can be appropriately selected in accordance with the object. Examples include a resist pattern removing process and the like.

The resist pattern removing process is a process of removing the resist pattern after the above-described patterning process, and can be carried out, for example, by using a removing liquid.

The removing liquid is not particularly limited, and can be appropriately selected from among known removing liquids, and alkali aqueous solutions and the like are suitable examples. When an alkali aqueous solution is used, as compared with a general removing liquid using an organic amine or an organic solvent or the like, not only can the costs and the burden on the environment be reduced, but also, the resist pattern can be easily removed. In particular, in a case in which the tannin is a hydrolyzable tannin, because the ester bond portions within the tannin are rapidly hydrolyzed by the alkali, there is the advantage that the resist pattern can be removed even more easily.

The alkali aqueous solution is not particularly limited, and can be appropriately selected in accordance with the object. An alkali developing liquid such as a tetramethylammonium hydroxide solution or the like can be used as is. The pH of the alkali aqueous solution is preferably 13 or more.

If the pH is less than 13, the hydrolysis of the tannin may be slow, and a long time may be required for removal of the resist pattern.

In accordance with the method of manufacturing a semiconductor device of the present invention, a fine, highly-detailed resist pattern, in which the occurrence of nanoedge roughness is suppressed, can be formed easily and efficiently, and it is possible to efficiently mass produce a high-performance semiconductor device, e.g., a flash memory, a DRAM, an FRAM or the like, which has a fine wiring pattern formed by using the resist pattern.

According to the present invention, it is possible to provide a resist composition which can easily and efficiently and at low cost form a fine resist pattern at which the occurrence of nanoedge roughness can be suppressed, and further, whose burden on the environment is small; and a method of forming a resist pattern which, by using the resist composition, can easily and efficiently and at a low cost form a fine resist pattern without nanoedge roughness which can cause problems; and a method of manufacturing a semiconductor device which, by using the resist composition, can form a fine resist pattern without nanoedge roughness which can cause problems, and which enables efficient mass production of a high-performance semiconductor device having fine wiring pattern formed by using the resist pattern; and a high-performance semiconductor device having a fine wiring pattern and manufactured by the method of manufacturing a semiconductor device.

The resist composition according to the present invention can easily and efficiently and at low cost form a fine resist pattern at which the occurrence of nanoedge roughness can be suppressed, and further, the burden of the resist composition on the environment is small. Therefore, the resist composition can be suitably applied to various types of patterning methods, methods of manufacturing a semiconductor device, and the like. The resist composition according to the present invention can be particularly suitably used in the method of forming a resist pattern according to the present invention and the method of manufacturing a semiconductor device according to the present invention.

The method of forming a resist pattern of the present invention can be suitably applied to the manufacturing of, for example, functional parts such as mask patterns, reticle patterns, magnetic heads, LCDs (liquid crystal displays), PDPs (plasma display panels), SAW filters (surface-acoustic-wave filters), and the like, and optical parts used in the connecting of optical wires, and fine parts such as microactuators and the like, and semiconductor devices, and can suitably be used in the method of manufacturing a semiconductor device according to the present invention.

The method of manufacturing a semiconductor device according to the present invention can be suitably used in the manufacturing of various types of semiconductor devices such as flash memories, DRAMs, FRAMs, and the like, and the semiconductor device according to the present invention in particular.

Hereinafter, Examples of the present invention will be described, but the present invention is not to be limited to these Examples.

EXAMPLE 1

—Preparation of Resist Composition—

A resist composition (coating liquid) was prepared on the basis of the following composition.

| | |
|---|---|
| Chinese tannin (hydrolyzable tannin, manufactured by Kanto Chemical Co., Inc.) | 100 parts by mass |
| Uryl derivative expressed by following structural formula (9) (the crosslinking agent, manufactured by Sanwa Chemical Co., Ltd.) | 20 parts by mass |
| Triphenylsulfonium perfluorobutane sulfonate (acid generator, manufactured by Midori Kagaku Co., Ltd.) | 3 parts by mass |
| Ethyl lactate (solvent, manufactured by Kanto Chemical Co., Inc.) | 1,000 parts by mass |

Structural formula (9)

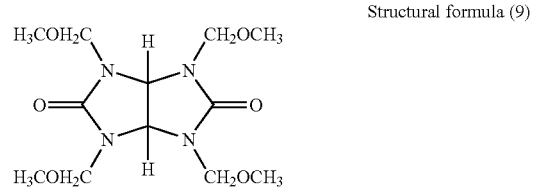

When the obtained resist composition was dissolved into THF (tetrahydrofuran) as a solvent and analyzed by gel permeation chromatography, no high molecular mass component corresponding to the polymer was detected.

—Experiment Evaluating Characteristics of Resist Composition—

The obtained resist composition (coating liquid) was coated to a thickness of 0.3 μm on a silicon wafer and prebaking was carried out for one minute at 110° C., and this was used as an exposure sample. The exposure sample was irradiated by exposure light of a wavelength of 248 nm so as to carry out exposure, and baking was carried out for one minute at 110° C. Thereafter, developing was carried out over 20 seconds by using water having a pH of 7. The sensitivity curve of the exposure sample at this time is shown in FIG. 1. The sensitivity curve of the exposure sample in a case of using an electron beam as the exposure light is shown in FIG. 2.

Figure 2:
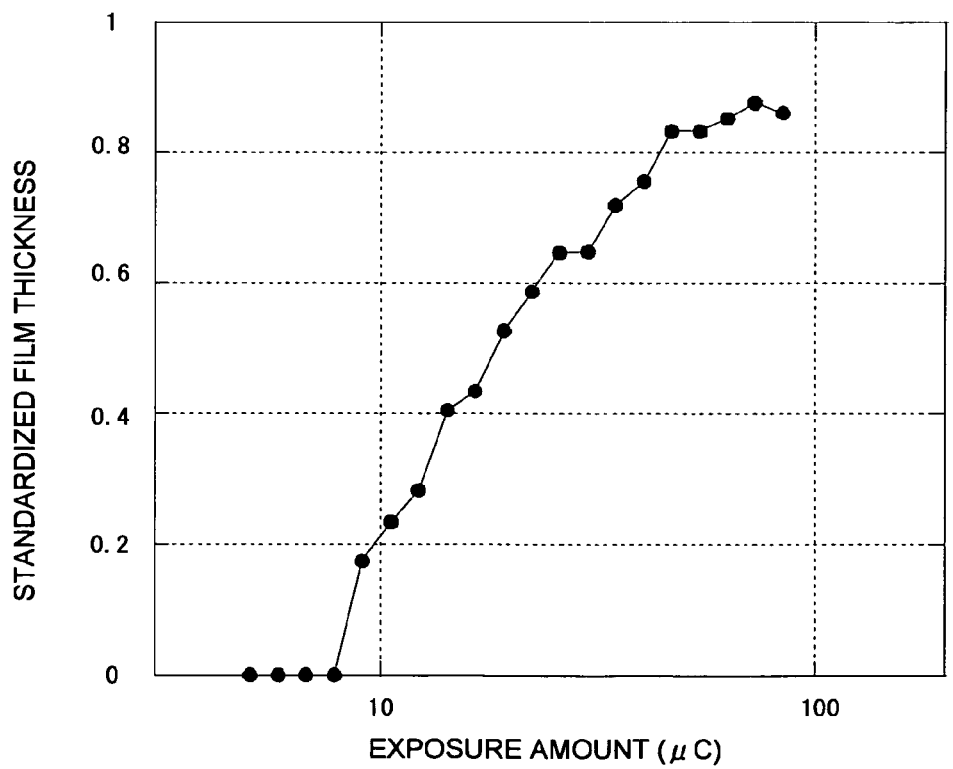
FIG. 2 is a graph showing a sensitivity curve at the time of irradiating a resist composition of Example 1 with an electron beam.

From FIG. 1 and FIG. 2, it can be understood that the resist composition according to the present invention behaves as a negative resist.

Next, when the exposure sample which was developed was immersed in a 2.38% by mass tetramethylammonium hydroxide solution (manufactured by Zeon Corporation, pH=14), it was found that the remaining film portions (the exposed portions) at the exposure sample disappeared within 2 seconds, and these remaining film portions could be removed by an alkali aqueous solution.

EXAMPLE 2

Resist compositions were prepared, and experiments evaluating the characteristics of the obtained resist compositions were carried out in the same manner as in Example 1, except that the uryl derivative used as the crosslinking agent in Example 1 was replaced with the urea derivative expressed by following structural formula (8), the pyrogallol derivative expressed by following structural formula (38), and the melamine derivative expressed by following structural formula (7), respectively.

Structural formula (8)

HOCH$_2$—$[$NH—CO—NH—CH$_2]_{\overline{4}}$NH—CO—NH—CH$_2$OH

Structural formula (38)

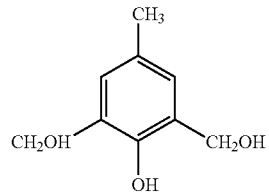

Note that the pyrogallol derivative expressed by above structural formula (38) is 2,6-bisdroxymethyl-p-cresol.

Structural formula (7)

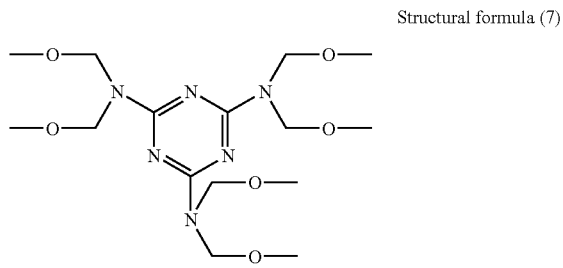

When the obtained resist compositions were dissolved into THF (tetrahydrofuran) as a solvent, respectively, and analyzed by gel permeation chromatography, no high molecular mass component corresponding to the polymer was detected.

Figure 3:
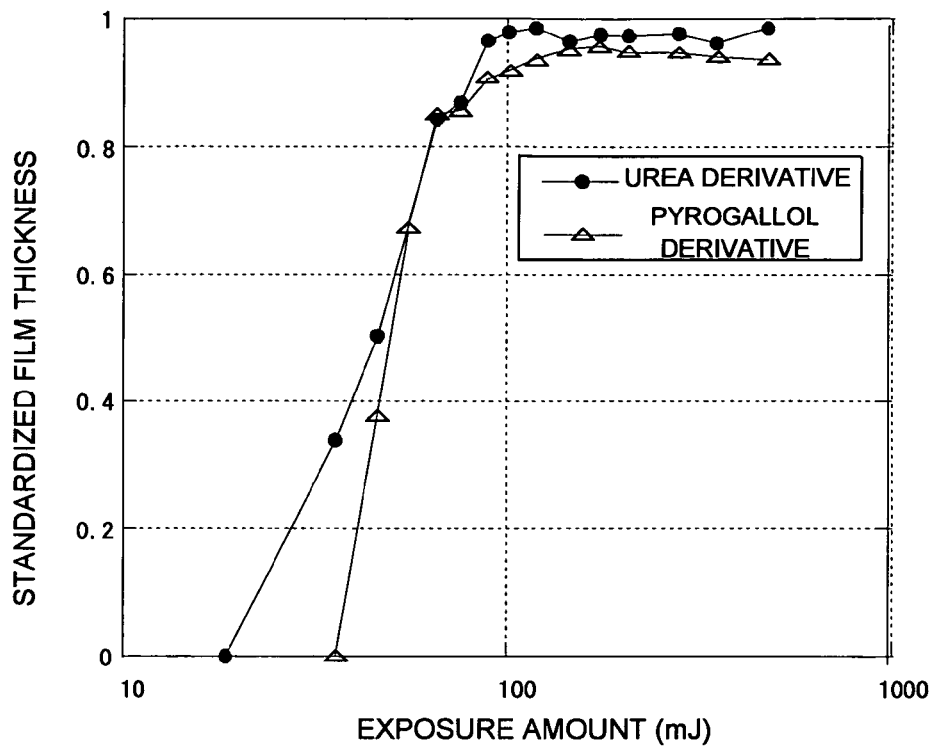
FIG. 3 is a graph showing sensitivity curves of resist compositions at the time when a urea derivative and a pyrogallol derivative are used as a crosslinking agent.
Figure 4:
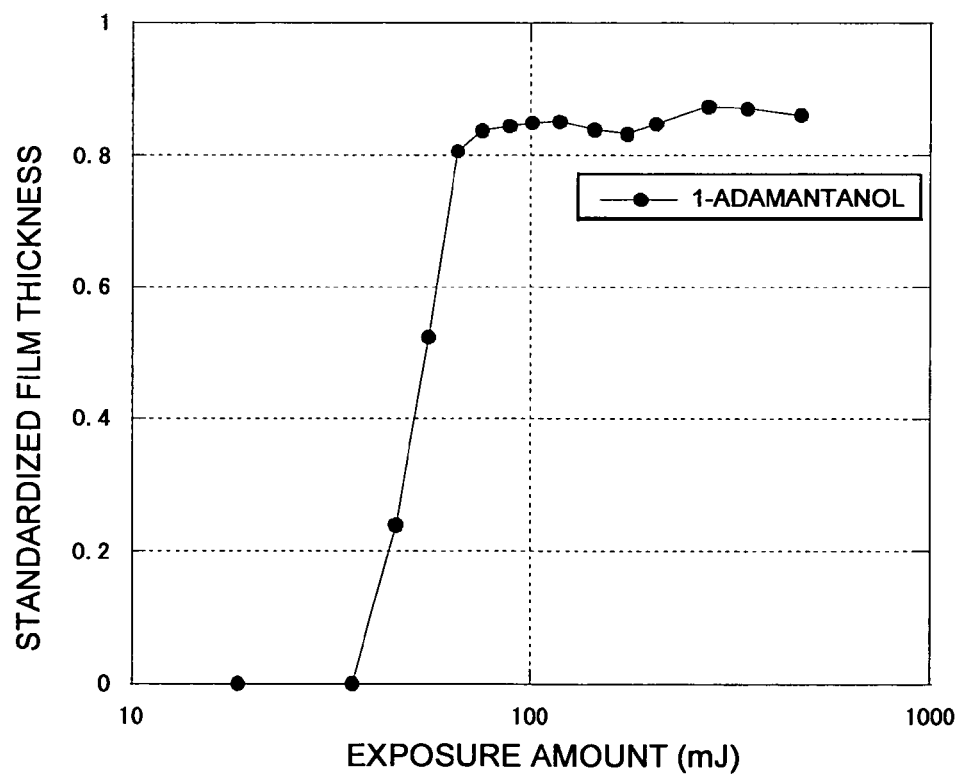
FIG. 4 is a graph showing a sensitivity curve of a resist composition at a time when a melamine derivative is used as a crosslinking agent.

The sensitivity curves of the exposure samples prepared by the same method as in Example 1 are shown in FIG. 3 for the urea derivative and the pyrogallol derivative, and in FIG. 4 for the melamine derivative. From FIG. 3 and FIG. 4, it can be understood that the resist compositions of the present invention using any of the urea derivative, the pyrogallol derivative, and the melamine derivative also behaved as negative resists.

Then, when the exposure samples which were developed were immersed in 2.38% by mass tetramethylammonium hydroxide solutions (manufactured by Zeon Corporation), it was found that the remaining film portions (the exposed portions) at the exposure samples disappeared within 2 seconds, and these remaining film portions could be removed by an alkali aqueous solution.

EXAMPLE 3

A resist composition was prepared, and an experiment evaluating the characteristics of the obtained resist composition was carried out in the same manner as in Example 1, except that the uryl derivative used as the crosslinking agent in Example 1 was replaced with 1-adamantanol (manufactured by Kanto Chemical Co., Inc.) which imparted a polarity change.

When the obtained resist composition was dissolved in to THF (tetrahydrofuran) as a solvent and analyzed by gel permeation chromatography, no high molecular mass component corresponding to the polymer was detected.

Figure 5:
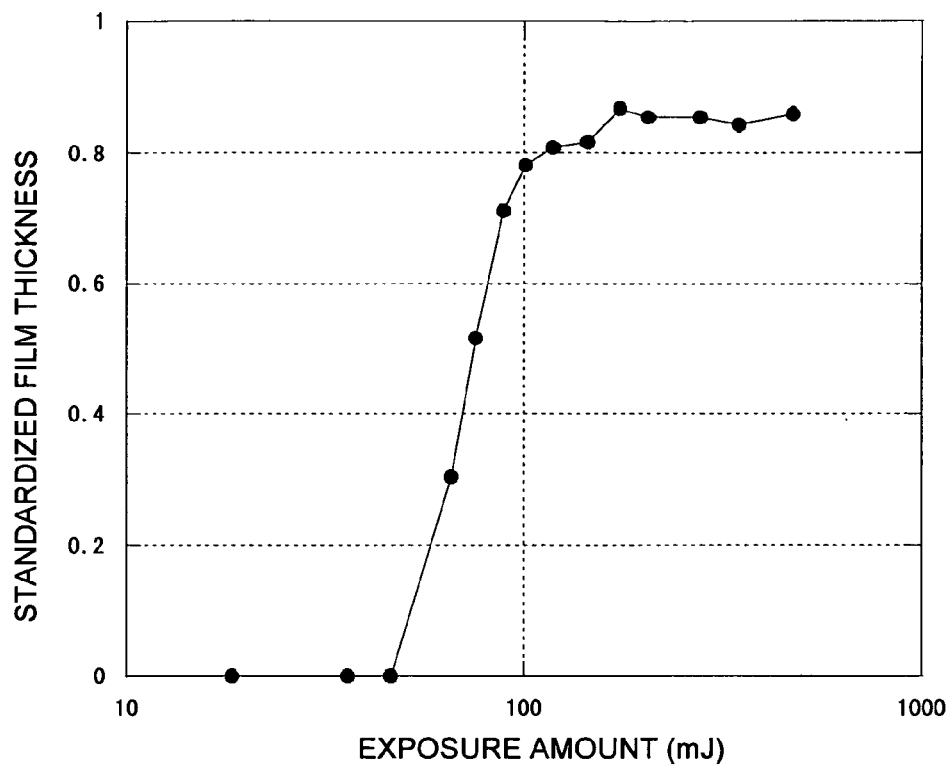
FIG. 5 is a graph showing a sensitivity curve of a resist composition of which polarity is changed by using 1-adamantanol.

The sensitivity curve of the exposure sample prepared by the same method as in Example 1 is shown in FIG. 5. From FIG. 5, it can be understood that the resist composition of the present invention using 1-adamantanol behaved as a negative resist. Note that, with 1-adamantanol, an increase in the molecular mass due to the crosslinking reaction does not occur, and therefore, it is clear that the resist becoming a negative resist is due to the polarity change (the pinacol translocation).

Then, when the exposure sample which was developed was immersed in a 2.38% by mass tetramethylammonium hydroxide solution (manufactured by Zeon Corporation), it was found that the remaining film portions (the exposed portions) at the exposure sample disappeared within 2 seconds, and these remaining film portions could be removed by an alkali aqueous solution.

EXAMPLE 4

A resist composition was prepared, and an experiment evaluating the characteristics of the obtained resist composition was carried out in the same manner as in Example 1, except that the 1,000 parts by mass of the ethyl lactate used as the solvent in Example 1 was replaced with 700 parts by mass of water and 70 parts by mass of isopropyl alcohol. Note that the isopropyl alcohol was added for the purpose of improving the solubility of the tannin or the like.

It was found that the obtained resist composition had good coatability, and that water could be suitably used as a solvent.

When the obtained resist composition was dissolved into THF (tetrahydrofuran) as a solvent and analyzed by gel permeation chromatography, no high molecular mass component corresponding to the polymer was detected.

Figure 6:
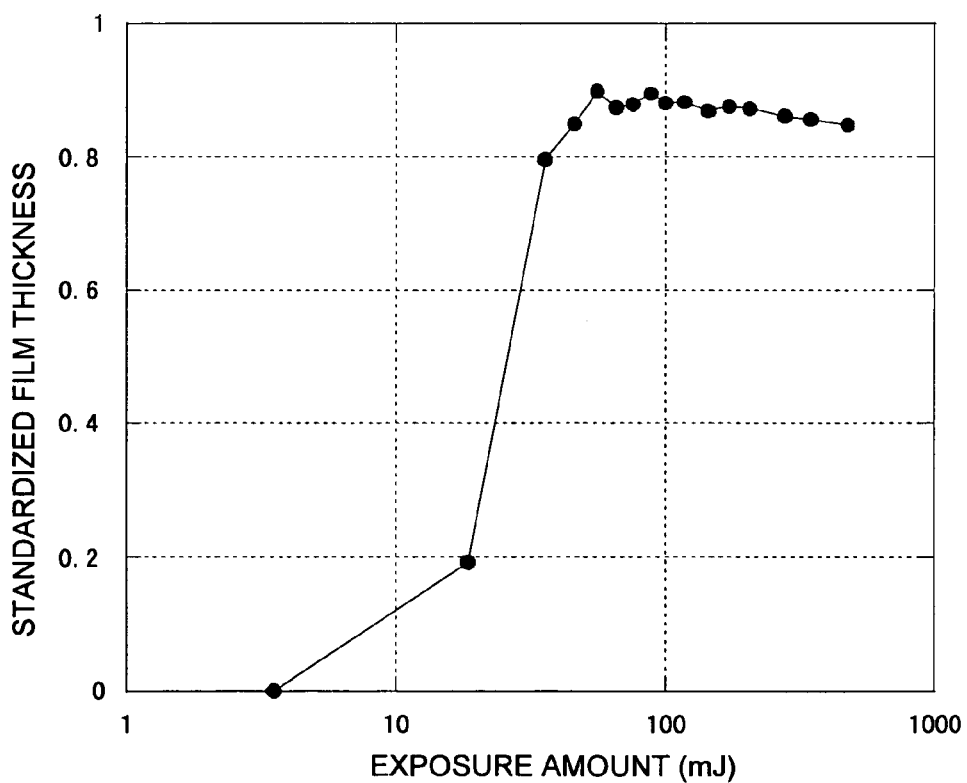
FIG. 6 is a graph showing a sensitivity curve of a resist composition of Example 4.
Figure 7:
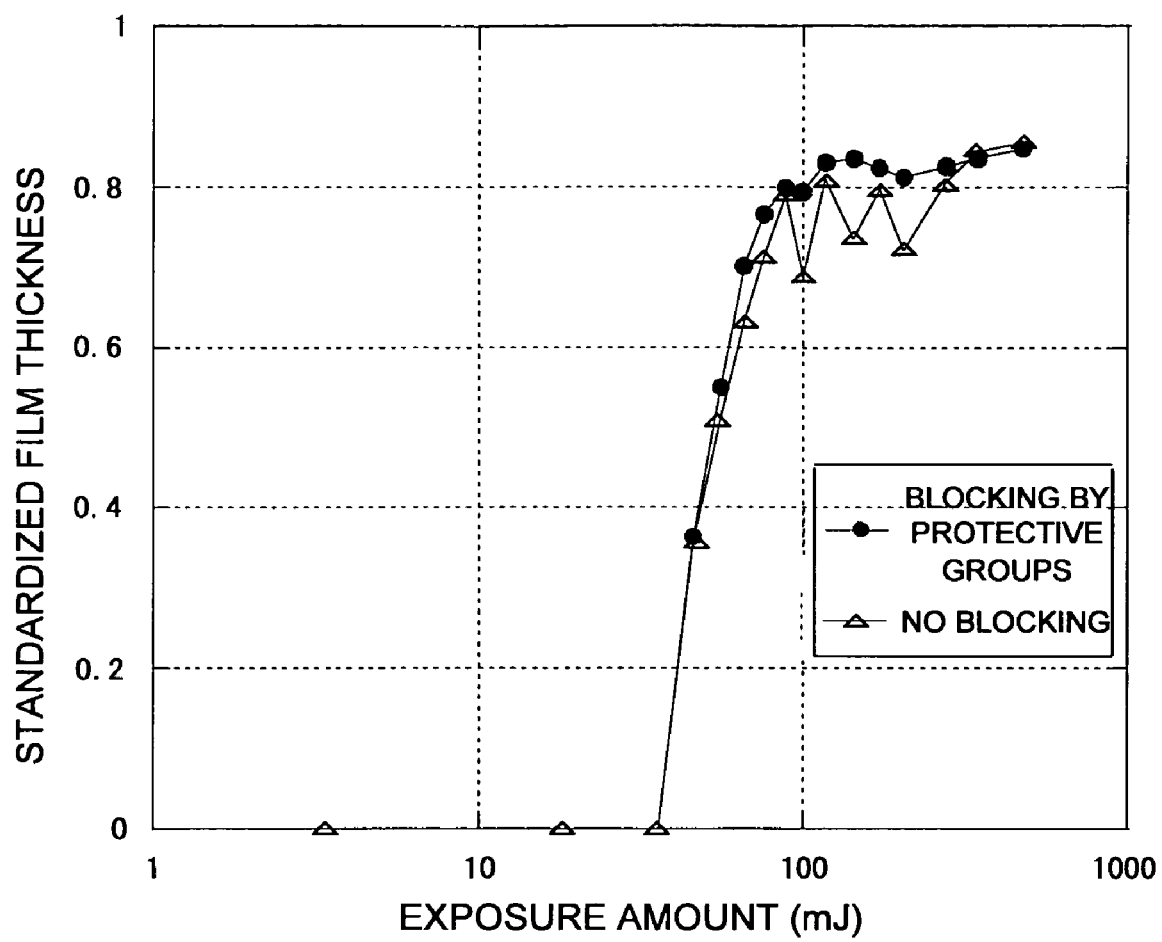
FIG. 7 is a graph showing a sensitivity curve of a resist composition containing a tannin in which hydroxyl groups are blocked by protective groups.

The sensitivity curve of the exposure sample prepared by the same method as in Example 1 is shown in FIG. 6. From FIG. 6, it can be understood that the resist composition of the present invention behaved as a negative resist.

Then, when the exposure sample which was developed was immersed in a 2.38% by mass tetramethylammonium hydroxide solution (manufactured by Zeon Corporation), it was found that the remaining film portions (the exposed portions) at the exposure sample disappeared within 2 seconds, and these remaining film portions could be removed by an alkali aqueous solution.

EXAMPLE 5

A resist composition was prepared, and an experiment evaluating the characteristics of the obtained resist composition was carried out in the same manner as in Example 1, except that the Chinese tannin in Example 1 was replaced with a tannin in which some of the hydroxyl groups were substituted (blocked) by protective groups.

—Preparation of Tannin—

5 grams of Turkish tannin (the hydrolyzable tannin, manufactured by Inagaki Yakuhin Co., Ltd.) was dissolved in 200 ml of THF (tetrahydrofuran), and 0.9 grams of silver (I) oxide was added thereto, and the mixture was stirred. Over 30 minutes, 1 gram of iodomethane and 50 ml of THF were added by drops thereto. The mixture was stirred for 2 hours at room temperature, and filtering was carried out such that the mixture was refined. A tannin, in which some of the hydroxyl groups were substituted (blocked) by methyl groups (the protective groups) was thereby obtained.

—Preparation of Resist Composition—

A resist composition was prepared on the basis of the following composition.

Tannin in which some of the hydroxyl groups were blocked by methyl groups 100 parts by mass 1,1,2,2-tetraphenyl-1,2-ethanediol (crosslinking agent, manufactured by Sigma-Aldrich Corporation) 20 parts by mass Triphenylsulfonium perfluorobutane sulfonate (acid generator, manufactured by Midori Kagaku Co., Ltd.) 3 parts by mass Ethyl lactate (solvent, manufactured by Kanto Chemical Co., Inc.) 1000 parts by mass The sensitivity curve of the exposure sample prepared by the same method as in Example 1 is shown in FIG. 6. Further, for comparison, the sensitivity curve of an exposure sample prepared by using a tannin in which the hydroxyl groups were not substituted (blocked) by protective groups is shown together in FIG. 6.

From FIG. 6, it is understood that, with the tannin in which the hydroxyl groups were not blocked by protective groups, recesses and protrusions which were considered to be caused by film reduction were observed in the high exposure amount regions, but with the tannin in which hydroxyl groups were blocked by methyl groups, the film reduction was decreased. This is thought to be due to the fact that, due to some of the hydroxyl groups being blocked by methyl groups, the developing dissolution rate decreases and film reduction is suppressed.

EXAMPLE 6

—Formation of Resist Patterns—

The resist compositions (coating liquids) obtained in Examples 1 through 5 were coated to a thickness of 0.3 µm on silicon wafers so that resist films were formed. Next, the resist films were irradiated by KrF excimer laser light in a line-and-space pattern of 0.3 µm. Thereafter, developing was carried out by using water of a pH of 7, and resist patterns were formed. The nanoedge roughness of the obtained resist patterns was measured by the following method. Further, the etching resistance of the resist films was evaluated by the following method.

<Measurement of Nanoedge Roughness>

The obtained resist pattern was observed by using a scanning electron microscope (SEM) ("S-4500", manufactured by Hitachi Ltd.), and at the observed region, the largest difference between a recess and a protrusion at the resist pattern end portion was measured as the nanoedge roughness.

As a result, at the resist patterns formed by using the resist compositions obtained in Examples 1 through 5, the nanoedge roughness (difference between recess and projection) was, in each case, 5 nm or less.

Further, in Example 6, because developing was carried out by using water, the costs and the burden on the environment could be reduced. Further, because the majority of the waste developing liquid after development was the tannin and water, the processing cost could be reduced.

<Etching Resistance>

By using an etching device (a parallel flat plate type RIE device, manufactured by Fujitsu Ltd.), the resist films formed by the resist compositions (coating liquids) obtained in Examples 1 through 5 were etched for three minutes under the conditions of an electrode voltage of 50 W/cm$^2$ and pressure of 0.03 Torr, by using a mixed gas, in which the ratio of carbon tetrafluoride to oxygen was 96:4, as an etching gas. The film reduction amount of the resist film was measured, and the etching rate was calculated. Further, for comparison, measurement was similarly carried out on an AZ 6100 (AZ Electronic Materials) which was a novolak resist, and relative evaluation was carried out by using the etching rate of this novolak resist as the standard. The results are shown in Table 1.

TABLE 1

| Material | Film Reduction Amount (nm) | Etching Rate (nm/min) | Rate Ratio (%) |
| --- | --- | --- | --- |
| AZ 6100 | 65 | 21.7 | 100 |
| Example 1 | 68 | 22.7 | 104 |
| Example 2 | 67 | 22.3 | 103 |
| Example 3 | 71 | 23.7 | 109 |
| Example 4 | 62 | 20.7 | 95 |
| Example 5 | 62 | 20.7 | 95 |

From the results of Table 1, it can be understood that the resist compositions according to the present invention had etching resistances equivalent to that of the novolak resist.

COMPARATIVE EXAMPLE 1

Resist compositions were prepared in the same manner as in Example 6, except that the tannin in Example 6 was replaced with polyvinyl phenol and novolak as polymers respectively, and resist patterns were formed and the nanoedge roughness was measured. As a result, the nanoedge roughness (difference between recess and protrusion) at the resist pattern formed by using the polyvinyl phenol was about 20 nm, and the nanoedge roughness at the resist pattern formed by using the novolak was about 30 nm.

From Example 6 and Comparative Example 1, it can be understood that, as compared with a resist pattern formed by using a conventional resist composition containing the polymer, the occurrence of nanoedge roughness was suppressed in the resist pattern formed by using the resist composition of the present invention containing the tannin.

EXAMPLE 7

—Manufacturing of MOS Transistor—

Figure 8A:
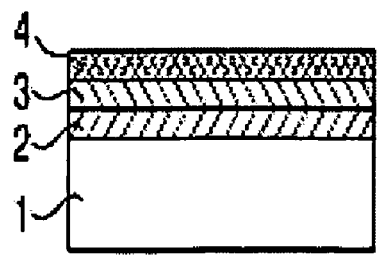
FIGS. 8A through 8F are sectional views for describing an example of a method of manufacturing a semiconductor device (a MOS transistor) of the present invention including formation of a resist pattern by using a resist composition of the present invention.
Figure 8B:
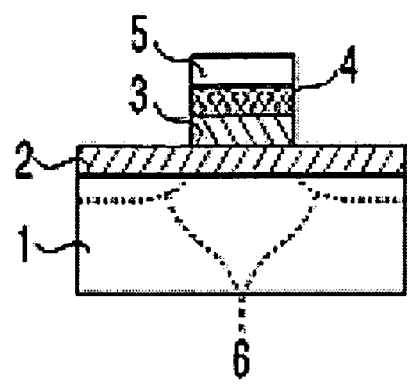
Figure 8C:
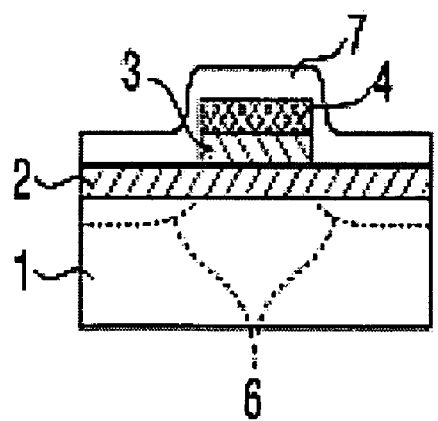
Figure 8D:
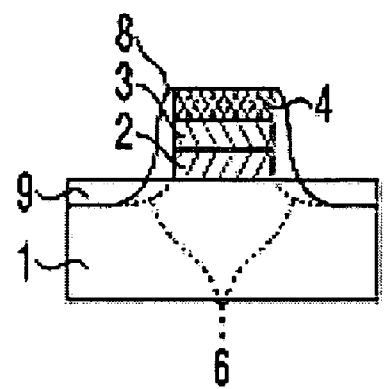
Figure 8E:
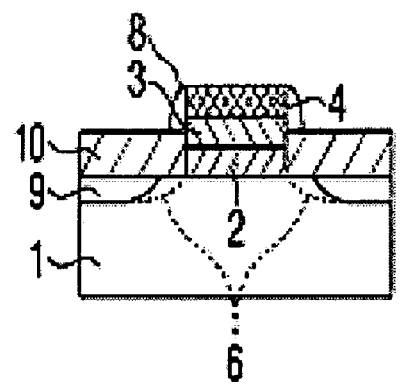
Figure 8F:
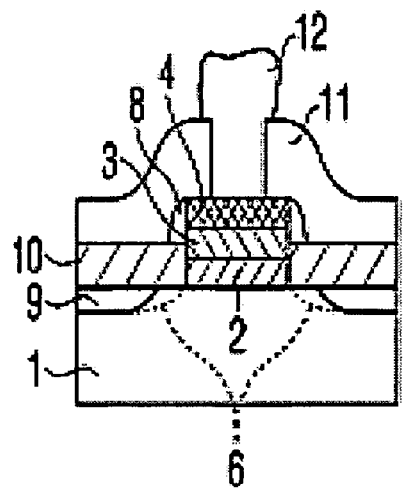

A MOS transistor was manufactured as follows. As shown in FIG. 8A, a gate oxide film 2 was formed on the surface of a silicon substrate 1, a polysilicon film 3 was formed thereon by means of CVD, and n-type impurities such as phosphorus or the like were doped so as to lower the resistance. Thereafter, a WSi film 4 was formed by means of sputtering or CVD. Next, as shown in FIG. 8B, after a resist composition 5 of the present invention was coated, prebaking was carried out, exposure was carried out by an electron beam or an excimer laser, and after exposure, baking and anisotropic etching were carried out such that the WSi film 4 and the polysilicon film 3 were etched, whereby a gate electrode consisting of the polysilicon film 3 and the WSi film 4 was formed. Next, phosphorus was doped by ion implantation such that N–diffused zones 6 having an LDD structure was formed. After resist removing, as shown in FIG. 8C, an oxide film 7 was formed on the entire surface by means of CVD. Then, as shown in FIG. 8D, anisotropic etching was carried out on the oxide film 7, and sidewalls 8 of the gate electrode consisting of the polysilicon film 3 and the WSi film 4 were formed. Then, by using the WSi film 4 and the sidewall 8 as a mask, N+ diffused zones 9 were formed by ion implantation. As shown in FIG. 8E, a heat treatment was carried out in a nitrogen atmosphere in order to activate the doped ions, and thereafter, heating was carried out in an oxygen atmosphere and the gate electrode was covered by a thermally-oxidized film 10. Thereafter, as shown in FIG. 8F, an interlayer dielectric 11 was formed by means of CVD, and further, contact holes were formed in the interlayer dielectric 11 and aluminum wiring 12 was formed, whereby an N-channel fine MOS transistor was completed.

EXAMPLE 8

—Manufacturing of Thin Film Magnetic Head—

Example 8 relates to the manufacturing of a thin film magnetic head as an applied example of a resist pattern formed by using the resist composition of the present invention.

Figure 9A:
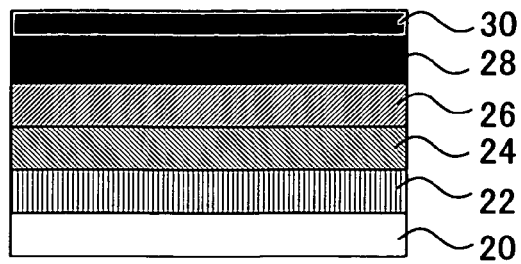
FIGS. 9A through 9I are sectional views for describing an example of a method of manufacturing a semiconductor device (a thin-film magnetic head) of the present invention including formation of a resist pattern by using a resist composition of the present invention.

As shown in FIG. 9A, a shield film 22 of FeN, a gap insulating film (silicon oxide film) 24, a magneto-resistance effect film 26, and a resist for liftoff (PMGI) film 28 were layered in this order by sputtering on a substrate 20. Then, the resist composition of the present invention was coated on the resist for liftoff (PMGI) film 28 so as to form a resist film 30.

Figure 9B:
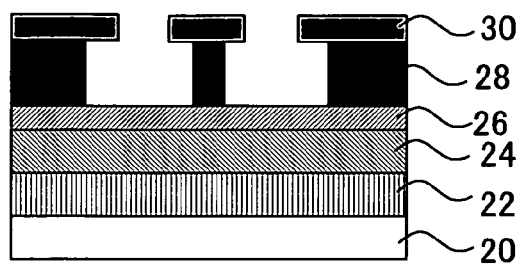

Next, as shown in FIG. 9B, the resist film 30 was exposed by KrF excimer laser light, and developing using water was carried out, whereby a fine pattern was formed. Note that, at this time, the resist for liftoff (PMGI) film 28 formed beneath the resist film 30 also was developed.

Figure 9C:
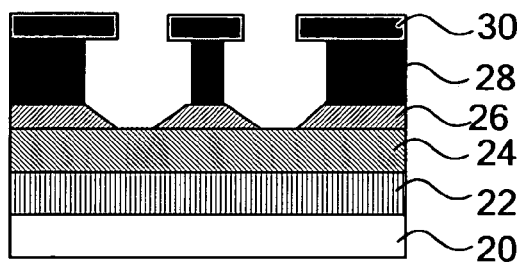

Then, as shown in FIG. 9C, by using the resist film 30 (resist pattern) as a mask, the magneto-resistance effect film 26 was etched in a taper shape by ion milling.

Figure 9D:
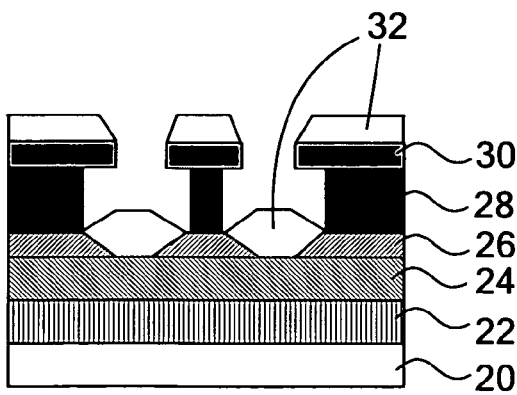
Figure 9E:
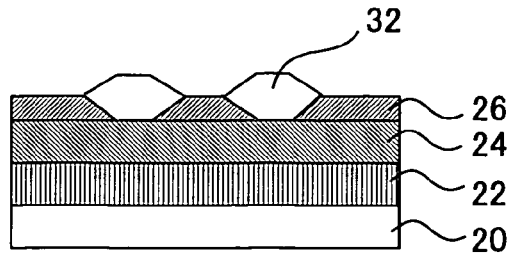

Subsequently, as shown in FIG. 9D, a TiW film 32 was formed by sputtering on the substrate 20 from above so as to cover the entire surface. Then, as shown in FIG. 9E, the resist for liftoff (PMGI) film 28, the resist film 30, and the TiW film 32 on the resist film 30 were removed by lifting-off.

Figure 9F:
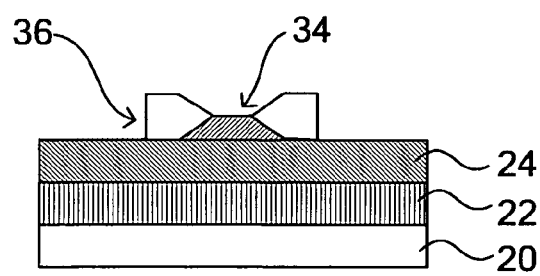
Figure 9G:
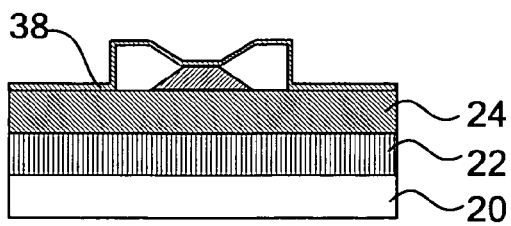

Next, by using the resist composition of the present invention, the magneto-resistance effect film 26 and the TiW film 32 were patterned, and thereafter, an MR element 34 and an electrode 36 were formed as shown in FIG. 9F. Then, as shown in FIG. 9G, a gap insulating film (silicon oxide film) 38 was formed on the substrate 20 from above on the entire surface.

Figure 9H:
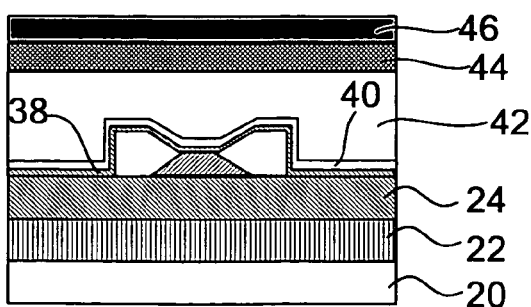
Figure 9I:
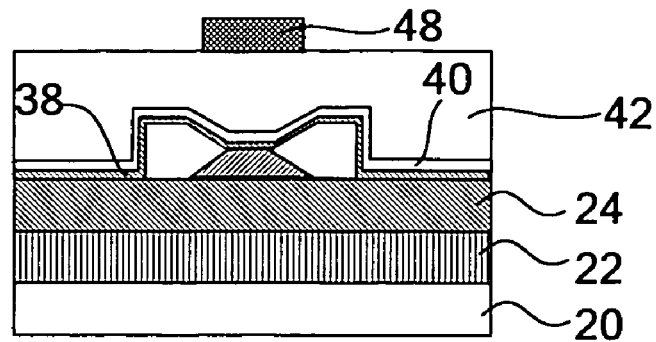
Figure 10A:
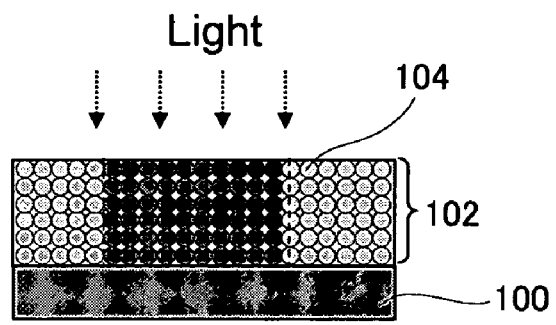
FIG. 10A is a sectional view schematically showing a resist layer formed by using a resist composition of the present invention.
Figure 10B:
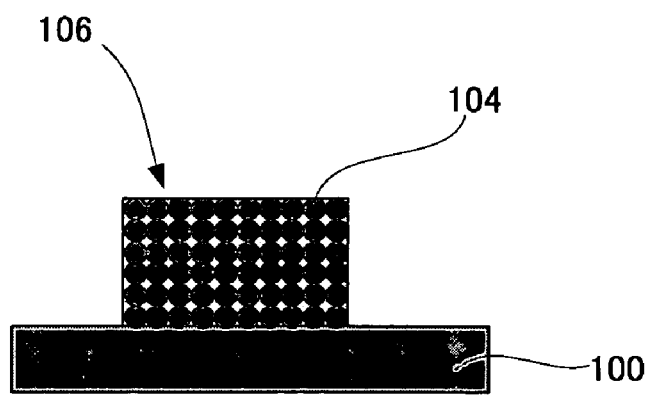
FIG. 10B is a sectional view schematically showing a resist pattern in which nanoedge roughness is small and which is formed by using the resist composition of the present invention.
Figure 11A:
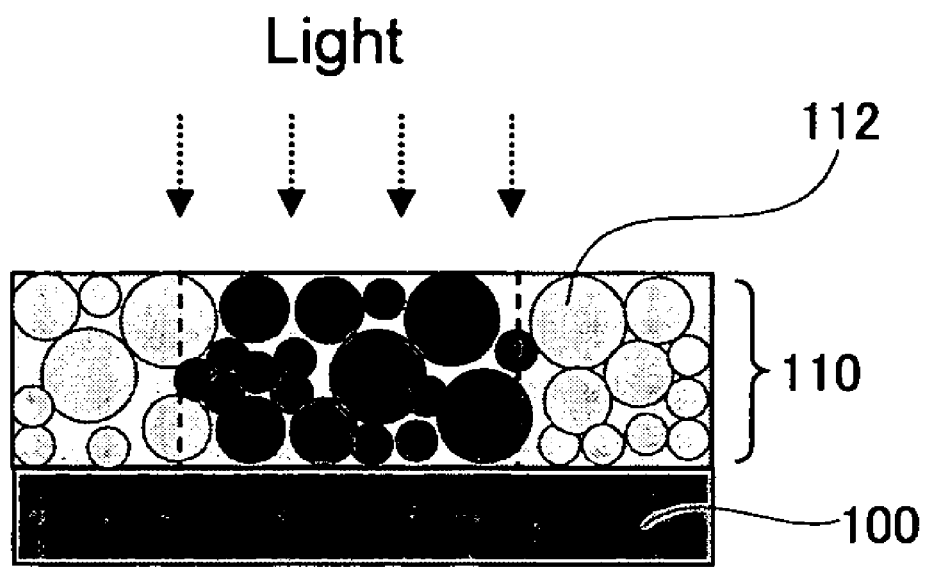
FIG. 11A is a sectional view schematically showing a resist layer which is formed by using a conventional resist composition.
Figure 11B:
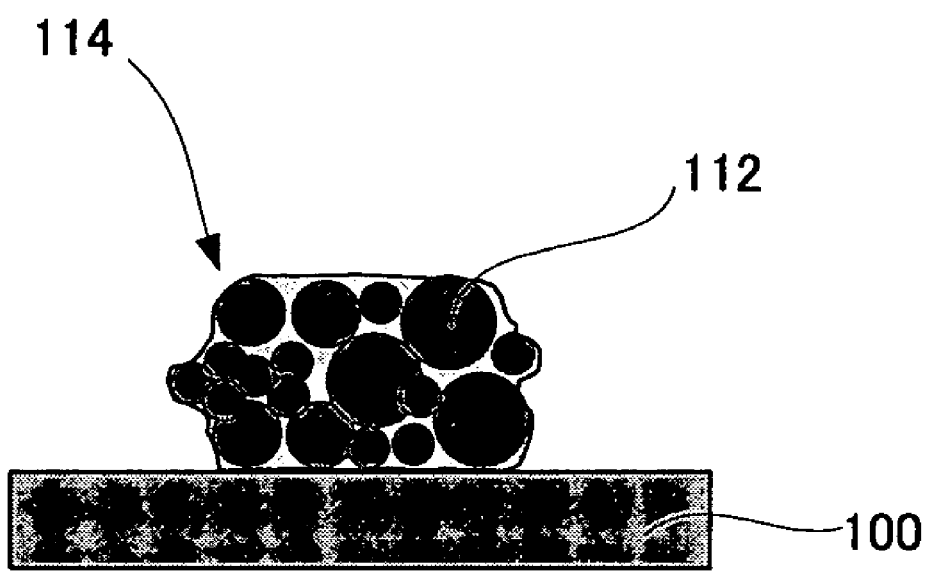

Next, as shown in FIG. 9H, a shield film 40 formed of FeNi, a gap film 42 formed of $Al_2O_3$, an FeNi film 44, and a resist film 46 formed of the resist composition according to the present invention, were layered in this order on the gap insulating film (silicon oxide film) 38. Then, the resist film 46 was exposed by KrF excimer laser light, and baking and alkali developing were carried out, whereby a fine pattern was formed.

Then, the FeNi film 44 was patterned by using the obtained fine pattern as a mask, and thereafter, a writing magnetic pole 48 was formed, whereby the thin film magnetic head was manufactured.

Because the magnetic head obtained here was manufactured by using a resist pattern formed by using the resist composition according to the present invention in which the occurrence of nanoedge roughness could be suppressed, the magnetic head was fine and highly detailed.

What is claimed is:

1. A resist composition comprising one of a tannin and a derivative thereof, a crosslinking agent and a polymer at an amount that does not exceed 1/100 in a mass ratio with respect to the solid content of the resist composition, wherein the polymer has a simple repeating unit from a low molecule compound.

2. The resist composition according to claim 1, wherein a mass ratio of the content of the one of the tannin and the derivative thereof in the resist composition at the time of resist film formation is greatest among other components of the resist composition.

3. The resist composition according to claim 1, wherein at least some of hydroxyl groups in the one of the tannin and the derivative thereof are substituted by protective groups.

4. The resist composition according to claim 3, wherein the protective group is at least one selected from the group consisting of alkyl group and phenyl group.

5. The resist composition according to claim 1, wherein the crosslinking agent is at least one selected from the group consisting of melamine derivatives, urea derivatives, uryl derivatives, and pyrogallol derivatives.

6. The resist composition according to claim 1, further comprising one selected from the group consisting of alcohols and pinacols.

7. The resist composition according to claim 1, wherein the one of the tannin and the derivative thereof is dissolved in a solvent, and the solvent contains water.

8. The resist composition according to claim 7, wherein the pH of the water is 4 to 10.

9. The resist composition according to claim 1, wherein the resist composition is a resist composition for etching.

10. The resist composition according to claim 1, wherein an etching rate of a resist film formed by using the resist composition is 125% or less of an etching rate of a novolak resist film, when carrying out etching under conditions of an electrode voltage of 50 W/cm$^2$ and a pressure of 0.03 Torr by using, as an etching gas, a mixed gas in which a ratio of carbon tetrafluoride to oxygen is 96:4.

11. A method of forming a resist pattern comprising:
    forming a resist film on a surface of an object to be processed, by using a resist composition; and
    exposing and developing the resist film,
    wherein the resist composition comprises one of a tannin and a derivative thereof, and a polymer at an amount that does not exceed 1/100 in a mass ratio with respect to the solid content of the resist composition, wherein the polymer has a simple repeating unit from a low molecule compound.

12. The method of forming a resist pattern according to claim 11, wherein water is used for developing the resist film.

13. The method of forming a resist pattern according to claim 12, wherein the pH of the water is 4 to 10.

14. A method of manufacturing a semiconductor device comprising:
    forming a resist film on a surface of an object to be processed, by using a resist composition;
    exposing and developing the resist film to form a resist pattern; and
    patterning the surface of the object by performing an etching through the resist pattern as a mask,
    wherein the resist composition comprises one of a tannin and a derivative thereof, and a polymer at an amount that does not exceed 1/100 in a mass ratio with respect to the solid content of the resist composition, wherein the polymer has a simple repeating unit from a low molecule compound.

15. The method of manufacturing a semiconductor device according to claim 14, wherein, after patterning the surface of the object, the resist pattern is removed by using an alkali aqueous solution.

16. The method of manufacturing a semiconductor device according to claim 15, wherein the pH of the alkali aqueous solution is 13 or more.

17. A semiconductor device manufactured by the method of manufacturing a semiconductor device according to claim 14.

18. A resist composition comprising:
    one of a tannin and a derivative thereof,
    an acid generator, and
    a polymer at an amount that does not exceed 1/100 in a mass ratio with respect to the solid content of the resist composition, wherein the polymer has a simple repeating unit from a low molecule compound." This claim now includes an acid generator which places the case in condition for allowance wherein the prior art to INOKAWA et al fails to recite that ingredient in the tannin containing composition.

* * * * *